US009396847B2

(12) United States Patent
Featherstone

(10) Patent No.: US 9,396,847 B2
(45) Date of Patent: Jul. 19, 2016

(54) EDGE-WOUND RESISTOR, RESISTOR ASSEMBLY, AND METHOD OF MAKING SAME

(71) Applicant: Vishay Dale Electronics, LLC, Columbus, NE (US)

(72) Inventor: Daniel Featherstone, Cedarburg, WI (US)

(73) Assignee: Vishay Dale Electronics, LLC, Columbus, NE (US)

( * ) Notice: Subject to any disclaimer, the term of this patent is extended or adjusted under 35 U.S.C. 154(b) by 0 days.

(21) Appl. No.: 14/287,883

(22) Filed: May 27, 2014

(65) Prior Publication Data

US 2015/0348683 A1 Dec. 3, 2015

(51) Int. Cl.

*H01L 29/08* (2006.01)
*H01C 3/18* (2006.01)
*H01C 17/04* (2006.01)

(52) U.S. Cl.

CPC .................. *H01C 3/18* (2013.01); *H01C 17/04* (2013.01); *Y10T 29/49083* (2015.01)

(58) Field of Classification Search

CPC ........ H01C 10/00; H01C 10/38; H01L 29/86; H01L 23/5228; H01L 27/0802; H01R 4/52; H01R 13/2421; H01R 13/2435; H01R 13/2492
USPC .................................................. 219/552, 556
See application file for complete search history.

(56) References Cited

U.S. PATENT DOCUMENTS 1,550,640 A 8/1925 Whittingham
1,662,771 A 3/1928 Whittingham
1,687,357 A 10/1928 Whittingham
1,706,014 A 3/1929 Whittingham
1,728,090 A 9/1929 Whittingham
2,032,104 A 1/1933 Umstott
2,050,221 A 8/1936 Frese
2,061,516 A 11/1936 Frese
2,390,790 A 12/1945 Immel et al.
2,560,690 A 7/1951 Griffes et al.
3,218,437 A 11/1965 Laing
3,887,894 A * 6/1975 Rudd ..................... H01C 10/38 338/161
4,028,793 A * 6/1977 Liebler .................... H01C 3/14 228/173.5
4,038,628 A * 7/1977 Salemi ..................... H01C 3/20 219/552

(Continued)

OTHER PUBLICATIONS

Coudoint Edgewound Resistors, Hardware Reference, Edition Jun. 2009 (2 pages).

(Continued)

*Primary Examiner* — Michael Lebentritt
(74) *Attorney, Agent, or Firm* — Volpe and Koenig, P.C.

(57) ABSTRACT

A resistor, resistor assembly, and a method of making them are described, with advantages over existing resistors, resistor assemblies, and methods. The resistor includes a helical resistor element wound on an insulator. The insulator has a regularly spaced plurality of teeth on each of two opposite sides, with the helical resistor element situated within the teeth. The insulator provides support for the helical resistor element without use of a separate core within the insulator. The resistor may be assembled by inserting two toothed insulator pieces into a helical resistor element and separating the two insulator pieces such that turns of the helical resistor element are within the teeth of the first and second insulator pieces. Alternatively, the resistor may be assembled by winding a helical resistor element onto a toothed insulator piece.

12 Claims, 16 Drawing Sheets

(56) References Cited

U.S. PATENT DOCUMENTS

| | | | | | |
|---|---|---|---|---|---|
| 4,230,933 | A * | 10/1980 | Glucksman | H05B 3/16 | 219/517 |
| 4,238,756 | A | 12/1980 | Immel | | |
| 4,652,852 | A * | 3/1987 | Asai | H01C 10/30 | 219/550 |
| 5,138,138 | A * | 8/1992 | Theilacker | A61B 6/045 | 219/217 |
| D662,895 | S | 7/2012 | Kimura et al. | | |
| 8,373,430 | B1 * | 2/2013 | Sochor | H01R 13/2421 | 29/874 |
| 8,460,010 | B2 * | 6/2013 | Kimura | G01R 1/06722 | 439/66 |
| 8,519,727 | B2 * | 8/2013 | Yamamoto | G01R 1/06722 | 324/755.05 |
| 8,547,128 | B1 * | 10/2013 | Sochor | H01R 13/2421 | 324/750.25 |
| 8,764,458 | B1 * | 7/2014 | Rathi | H04M 1/0274 | 439/66 |
| D711,326 | S * | 8/2014 | Shibutani | D13/154 | |
| 9,124,013 | B2 * | 9/2015 | Frushhour | H01R 13/2464 | |
| 2010/0267291 | A1 | 10/2010 | Chabineau-Lovgren et al. | | |
| 2011/0171839 | A1 | 7/2011 | Yang et al. | | |
| 2012/0129408 | A1 | 5/2012 | Kimura et al. | | |
| 2012/0214356 | A1 | 8/2012 | Hasegawa | | |

OTHER PUBLICATIONS

Vishay EDG Series Edgewound Power Resistor, Revision: Dec. 11, 2012 (2 pages).

Sungjin Edge Wound Resistor, dated Jul. 28, 2013, [online], [accessed Sep. 4, 2015]. Available from Internet, <URL: http://sjohm.co.kr/products/product01.php>.

* cited by examiner

EDGE-WOUND RESISTOR, RESISTOR ASSEMBLY, AND METHOD OF MAKING SAME

BACKGROUND

Edge-wound resistors are used in applications requiring relatively low resistance and high power dissipation. FIG. 1 shows an existing edge-wound power resistor 100. Coiled resistor element 105 is wound around a pair of ceramic insulators 110*a*, 110*b*. Turns of resistor element 105 sit in successive teeth on each of the insulators 110*a*, 110*b*. An empty example of one such tooth is shown at 115. Insulators 110*a* and 110*b* are mechanically supported and held in place by a metal core 107 within insulators 110*a* and 110*b*. Insulators 110*a* and 110*b* extend the entire length of resistor 100 and have exposed ends 130*a* and 130*b*. Resistors such as that shown in FIG. 1 are assembled using a method requiring a great deal of adjustment of component positions before and during assembly.

SUMMARY

A resistor, resistor assembly, and a method of making them are described, with advantages over existing resistors, resistor assemblies, and methods. The resistor includes a helical resistor element edge-wound on an insulator. The insulator has a regularly spaced plurality of teeth on each of two opposite sides, with the helical resistor element situated within the teeth. The insulator provides support for the helical resistor element without use of a separate core within the insulator.

The resistor may be assembled by inserting two toothed insulator pieces into a helical resistor element and separating the two pieces such that turns of the helical resistor element are within the teeth of the first and second insulator pieces. Alternatively, the resistor may be assembled by winding a helical resistor element onto a toothed insulator piece.

BRIEF DESCRIPTION OF THE DRAWINGS

A more detailed understanding may be had from the following description, given by way of example in conjunction with the accompanying drawings wherein.

DETAILED DESCRIPTION OF THE EMBODIMENTS

There is a need for power resistors with fewer components and faster assembly times, resulting in reduction of material and assembly costs. Electrically insulating materials with increased mechanical strength enable the fabrication of such resistors.

Figure 1:
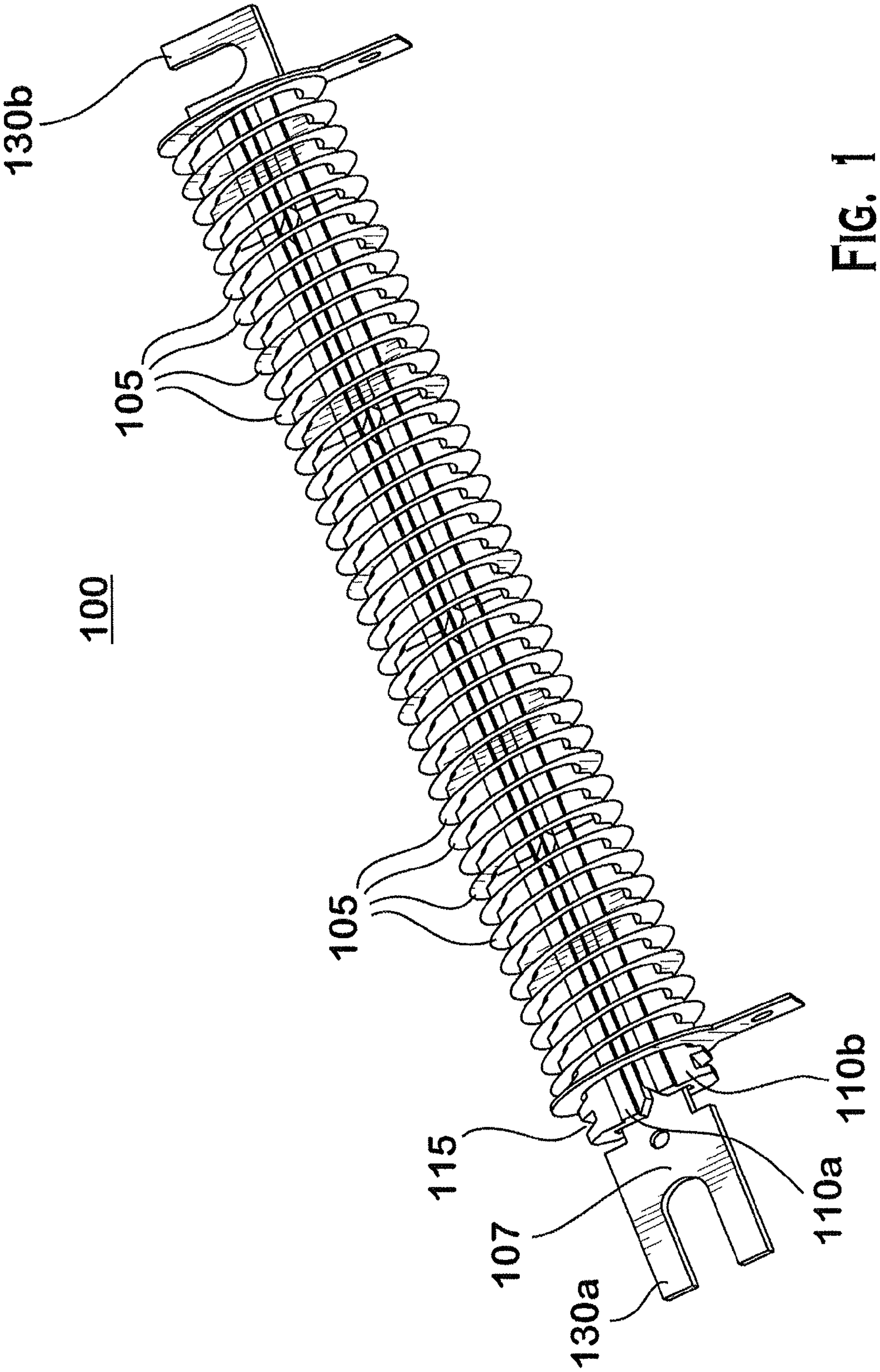
FIG. 1 (PRIOR ART)
FIG. 1 shows an existing resistor.
Figure 2:
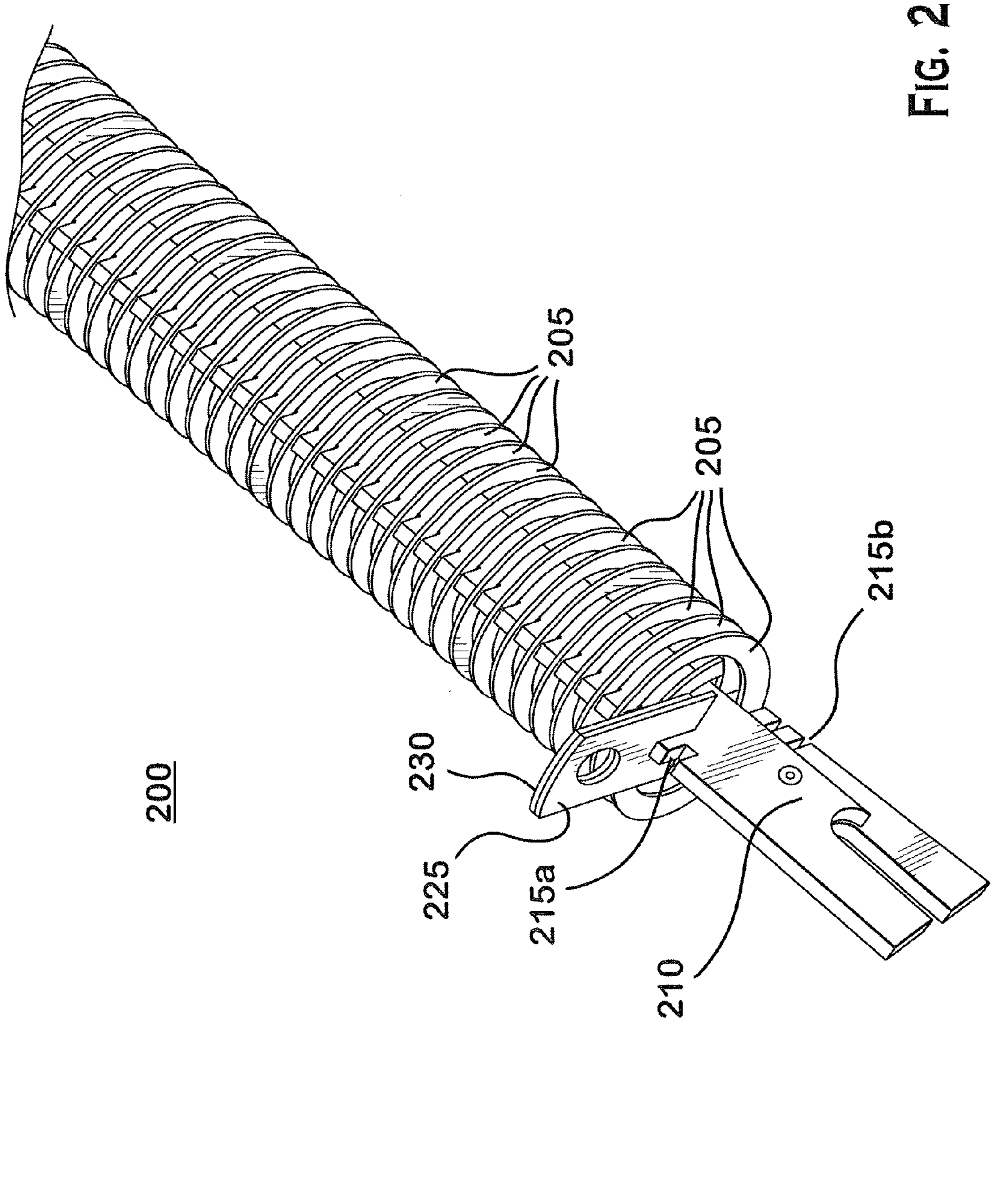
FIG. 2 shows an example of a resistor as described herein.
Figure 18:
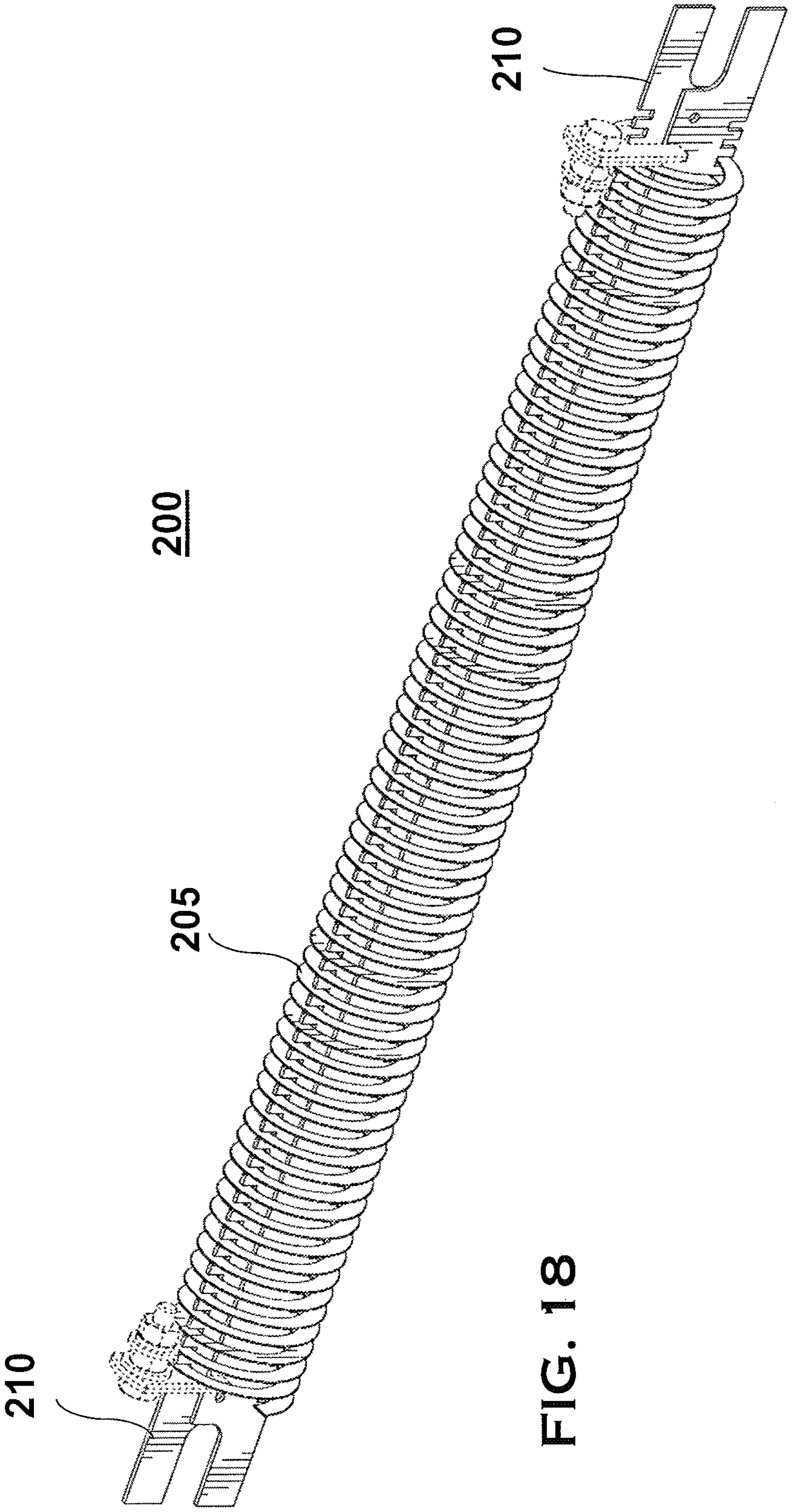
FIG. 18 shows a perspective view of an embodiment of a resistor according to the present invention.

FIGS. 2 and 18 show an embodiment of an edge-wound power resistor 200. A helical resistor element 205 is edge-wound on an insulator 210. Helical resistor element 205 is an electrical conductor configured as a single helix. Helical resistor element 205 has a cross-section that is essentially rectangular or square.

By contrast to existing resistors, insulator 210 alone provides support for helical resistor element 205 without the use of a separate core within insulator 210. Insulator 210 by itself provides sufficient mechanical integrity to support resistor element 205 and hold it in a fixed position. Insulator 210 is also designed to withstand the high operating temperatures of the resistor, which may be 450 degrees Celsius or higher. Suitable materials for insulator 210 include, but are not limited to, a glass, a fiberglass, ceramic, mica, mica board, silicon bonded mica laminate, steatite, cordierite, alumina, or pressed magnesium oxide. Insulator 210 has a regularly spaced plurality of teeth on each of two opposite sides. Helical resistor element 205 is situated within the teeth. Each turn of helical resistor element 205 may be situated within one tooth, with a portion of one of the edges of the essentially rectangular cross-section in contact with that tooth—hence the description "edge-wound." Two such teeth that do not have a turn of resistor element 205 within them, and therefore are visible in FIG. 2, are indicated at 215*a* and 215*b*. Teeth 215*a* and 215*b* are on opposite sides of insulator 210.

A locking tab 225 may be positioned and configured to prevent movement of resistor element 205. Locking tab 225 may be attached to a resistor terminal 230 that may be welded onto resistor element 205. This welding may be done before resistor element 205 is wound onto insulator 210. Insulator 210 may be a single piece of electrically insulating material. Alternatively, insulator 210 may be two or more attached pieces of electrically insulating material. The attached pieces may be planar and parallel to one another. Insulator 210 as a whole may be planar or essentially planar, but is not limited to being planar.

Figure 3:
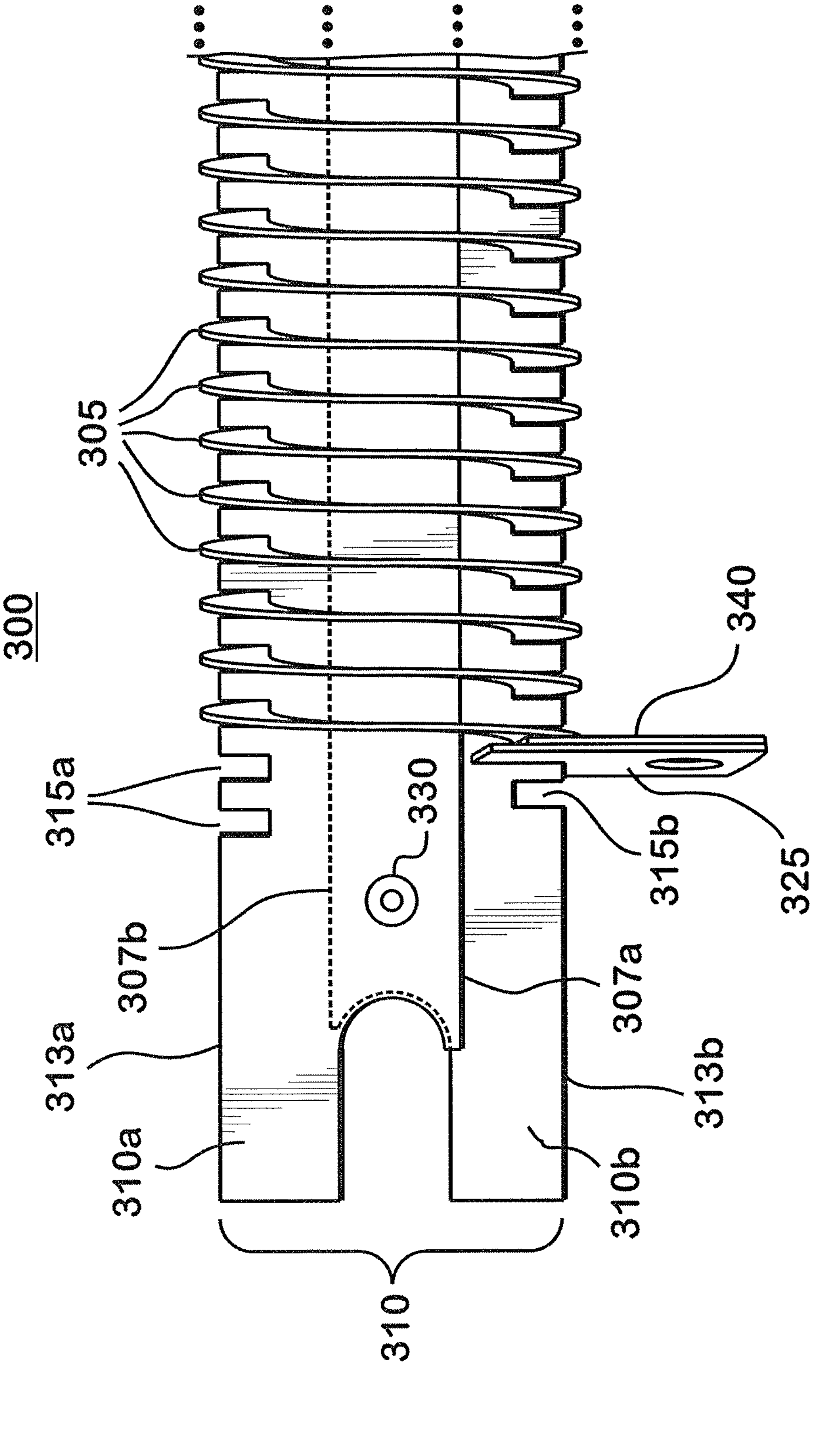
FIG. 3 shows a detail of the resistor shown in FIG. 2.

FIG. 3 shows magnified detail of one end of a first embodiment of an edge-wound power resistor 300. In this embodiment, insulator 310 is made of two attached insulator pieces 310*a* and 310*b*. In this embodiment, insulator pieces 310*a* and 310*b* are fastened together with a rivet at each end, such as a pop rivet 330, although other attachment methods may be used. Insulator piece 310*a* has an untoothed edge 307*a*, and an opposite toothed edge 313*a* with regularly spaced teeth 315*a* running over essentially its entire length. Similarly, insulator piece 310*b* has an untoothed edge 307*b*, and an opposite toothed edge 313*b* with regularly spaced teeth 315*b* running over essentially its entire length. Insulator piece 310*a* overlaps insulator piece 310*b*, and hidden edges of insulator piece 310*b* are indicated by dashed lines.

Helical resistor element 305 is edge-wound within the teeth 315*a* and 315*b*. Teeth 315*a* and 315*b* have a pitch that matches a pitch of helical resistor element 305. A locking tab 325 may be attached and configured to prevent movement of resistor element 305. Locking tab 325 may be attached to a resistor terminal 340 that may be welded onto resistor element 305. This welding may be done before resistor element 305 is wound onto insulator 310.

Figure 15:
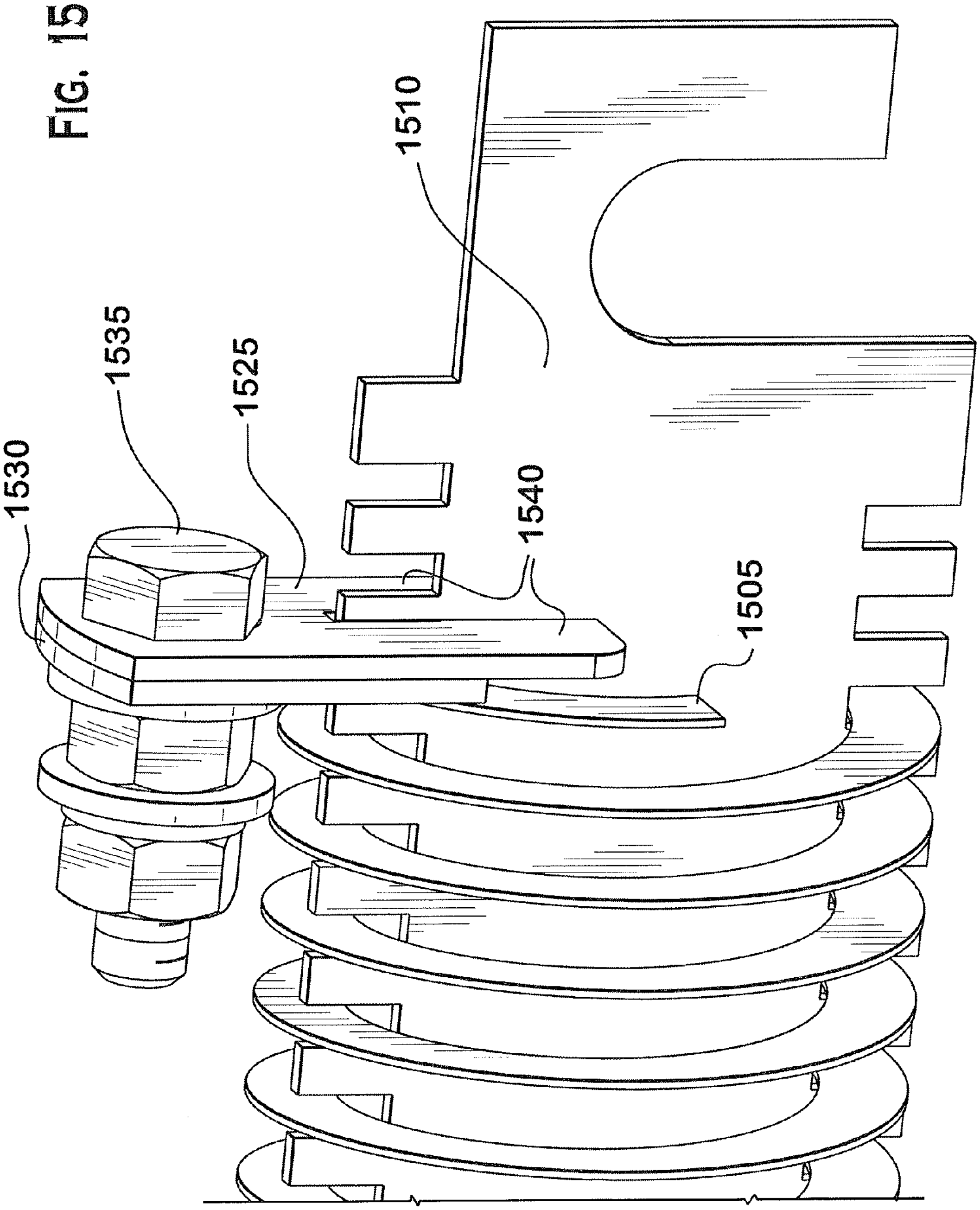
FIG. 15 shows another detail of a resistor as described herein.

FIG. 15 shows details of an example of a resistor terminal 1530 and locking tab 1525. Resistor terminal 1530 may be welded onto helical resistor element 1505. This welding may be done before resistor element 1505 is wound onto insulator 1510. Locking tab 1525 may be positioned over insulator

1510 and attached to resistor terminal 1530 with bolt 1535. Legs 1540 of locking tab 1525 prevent resistor element 1505 from rotating on insulator 1510.

The resistor structure described hereinbefore has advantages over existing edge-wound resistor designs. The described structures have fewer components to be assembled, resulting in shorter assembly times and reduced manufacturing costs, as described hereinafter. The use of lighter materials and fewer pieces overall results in significant weight reduction, 50% or more. The described edge-wound resistor produces less acoustic noise during operation than existing designs. This may be because insulator materials used for the support, such as 210 in FIG. 2, may not be as hard as ceramics or similar materials used as insulating support in existing designs. Power density, measured as Watts of dissipated heat per unit area with fixed temperature rise, has been measured to be at least 10% higher with the same fixed temperature rise than existing designs, which means higher power dissipation performance for the resistors described herein. This may be because in the described resistors, cross-sectional area in the vertical direction is significantly reduced, allowing for better convectional air flow across the resistive element.

Figure 4:
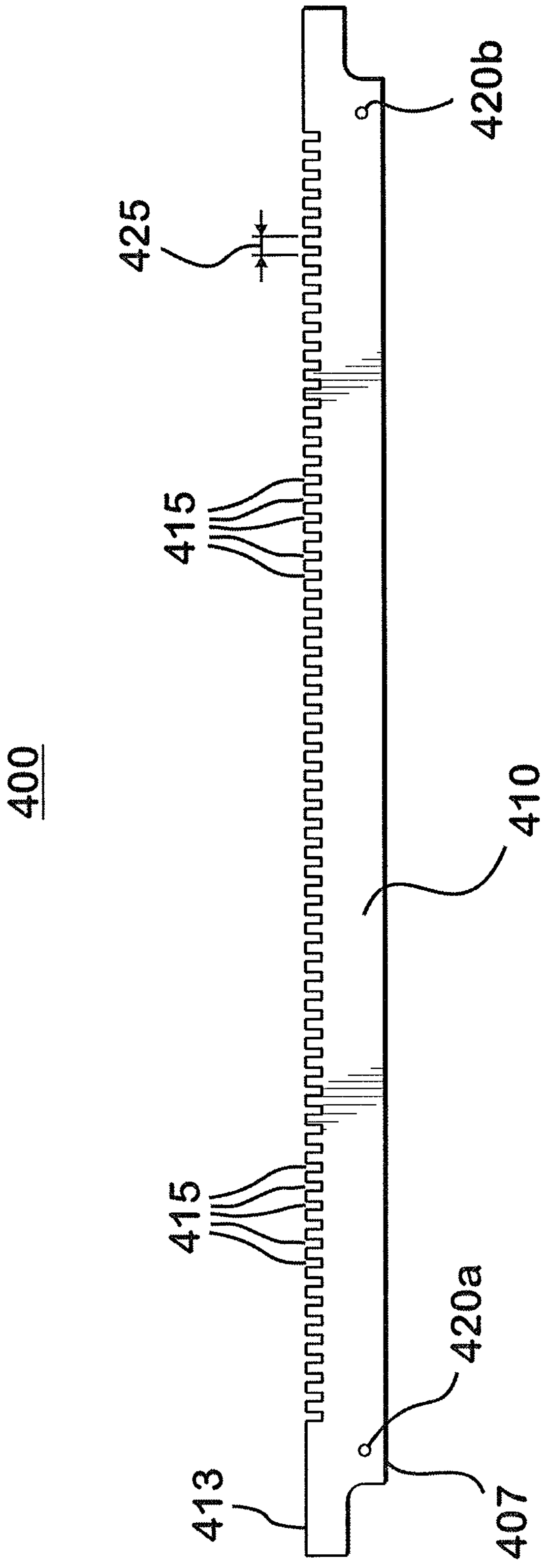
FIGS. 4-9 show an example of a method of assembling a resistor.

FIGS. 4-9 show an embodiment of a method of assembling an edge-wound resistor with a two-piece insulator, such as that shown in FIG. 3 and described hereinbefore. The method may be carried out by a human operator working with a machine or may be automated. FIG. 4 shows an example of an entire insulator piece 400. Insulator piece 400 has a toothed edge 413 and an opposite untoothed edge 407, both edges 413, 407 running nearly the entire length of insulator piece 400. Toothed edge 413 has teeth 415 having a pitch 425 matching a pitch of helical resistor element to be edge-wound onto insulator piece 400 into teeth 415. Insulator piece 400 has holes 420*a* and 420*b* at opposite ends for fastening insulator piece 400 to another insulator piece, as described hereinafter.

Figure 5:
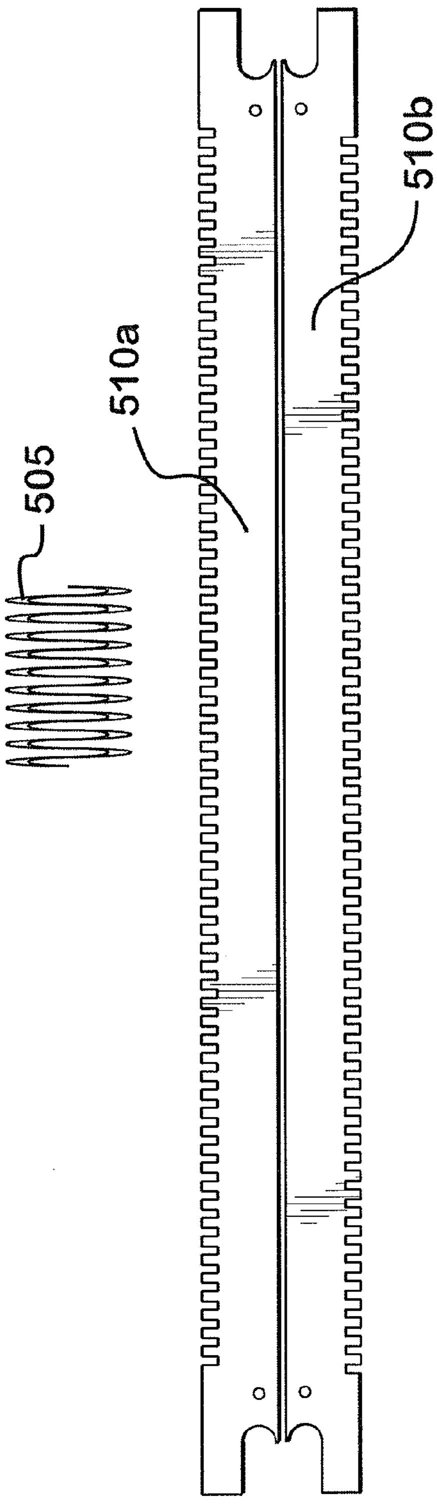

In FIG. 5, two insulator pieces 510*a* and 510*b* are shown separated with their untoothed edges adjacent one another. A helical resistor element 505 to be wound around insulator pieces 510*a* and 510*b* is also shown. The length of helical resistor element 505 is chosen to yield a desired resistance. For example, resistor element 505 may be fabricated from an 18SR stainless steel alloy. With a thickness of 0.018 inch, width of 0.342 inch, and length of 105 inch, the resistance will be 0.692±5% ohms. Increasing the length to 165" results in a higher resistance equal to 1.088±5% ohms. This long strip of steel is then turned on edge to create a helix that is turned onto the resistor support. Changing the thickness, width, or length, or the material itself, all change the resistance and surface area of the resistor, and these are adjusted to obtain the resistor desired for a particular application. In FIG. 5, resistor element 505 is shown much shorter than insulator pieces 510*a*, 510*b* for clarity. Resistor element 505 may extend over substantially the entire length of insulator pieces 510*a*, 510*b*, in the manner shown in FIGS. 2 and 18.

Figure 6:
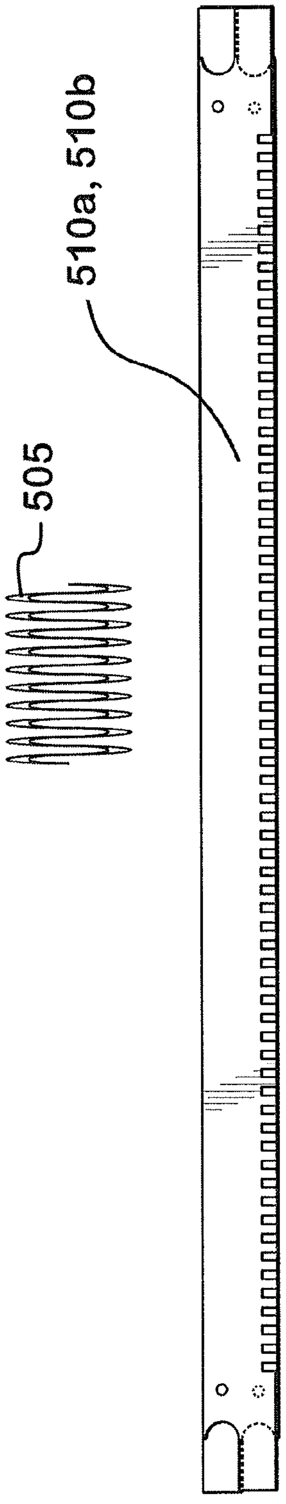

FIG. 6 shows insulator pieces 510*a* and 510*b* positioned one on top of the other, with insulator piece 510*b* on top of, and in proximity to, insulator piece 510*a*. The orientation of insulator pieces 510*a* and 510*b* is the same as shown in FIG. 5, with the toothed edges positioned opposite one another.

Figure 7:
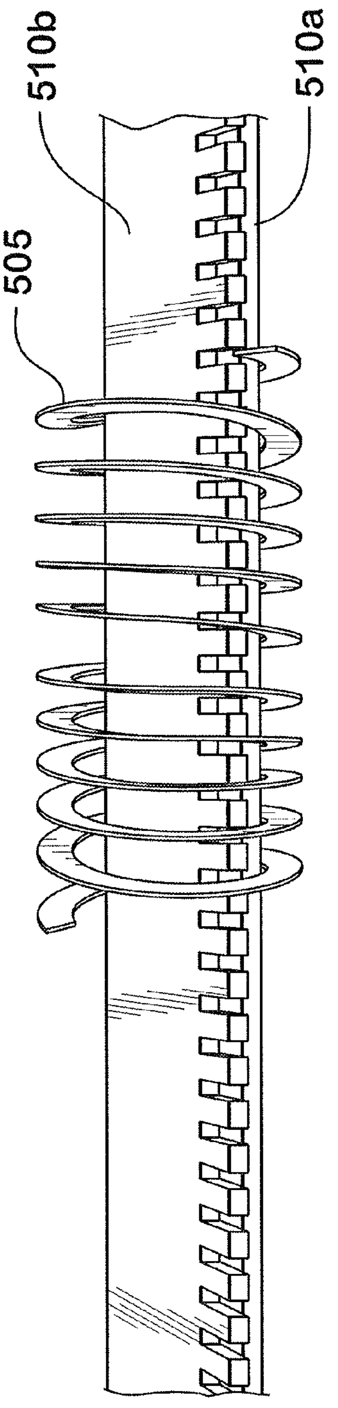

Next, as shown in FIG. 7, the two insulator pieces 510*a* and 510*b*, positioned as shown in FIG. 6, are inserted within, and along an axis of, helical resistor element 505. For this step, helical resistor element 505 may be held in a fixed position by a holder not shown. The holder may include one or more comb structures similar to insulator pieces 510*a* and 510*b*, having teeth with a pitch to match the pitch of resistor element 505. Such comb structures may hold resistor element 505 in a fixed position by attaching to outer edges of the windings of resistor element 505 while insulator pieces 510*a*, 510*b* are inserted within inner edges of the windings, as shown in FIG. 7.

Figure 8:
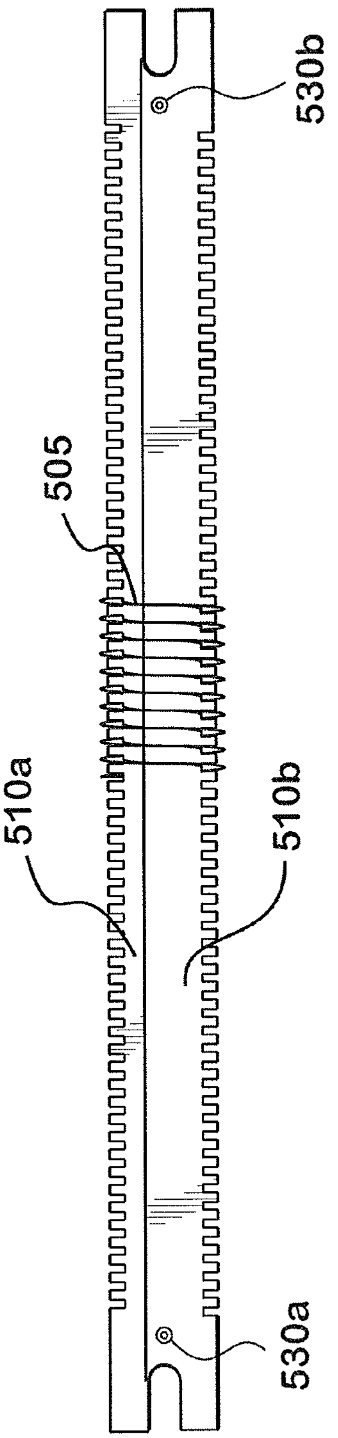

Next, as shown in FIG. 8, insulator pieces 510*a*, 510*b* may then be moved apart from each other to firmly anchor resistor element 505 in the teeth of both insulator pieces 510*a* and 510*b*. Overlap of insulator pieces 510*a* and 510*b* is maintained after they are moved. Insulator pieces 510*a* and 510*b* are then attached to each other. In the example shown in FIG. 8, insulator pieces 510*a* and 510*b* are attached to each other with two rivets 530*a* and 530*b* going through both pieces in the overlap region at opposite ends. In this embodiment insulator pieces 510*a* and 510*b* are positioned and attached to each other as two mutually parallel planes. Thus, a relatively rigid assembly of insulator pieces 510*a* and 510*b* with edge-wound resistor element 505 is produced. Attached insulator pieces 510*a* and 510*b* provide support for helical resistor element 505 without use of a separate core attached to the insulator pieces, as in existing designs. To complete the process a locking tab (not shown) similar to 325 in FIG. 3 may be attached to prevent movement of resistor element 505 on insulator pieces 510*a*, 510*b*.

Figure 9:
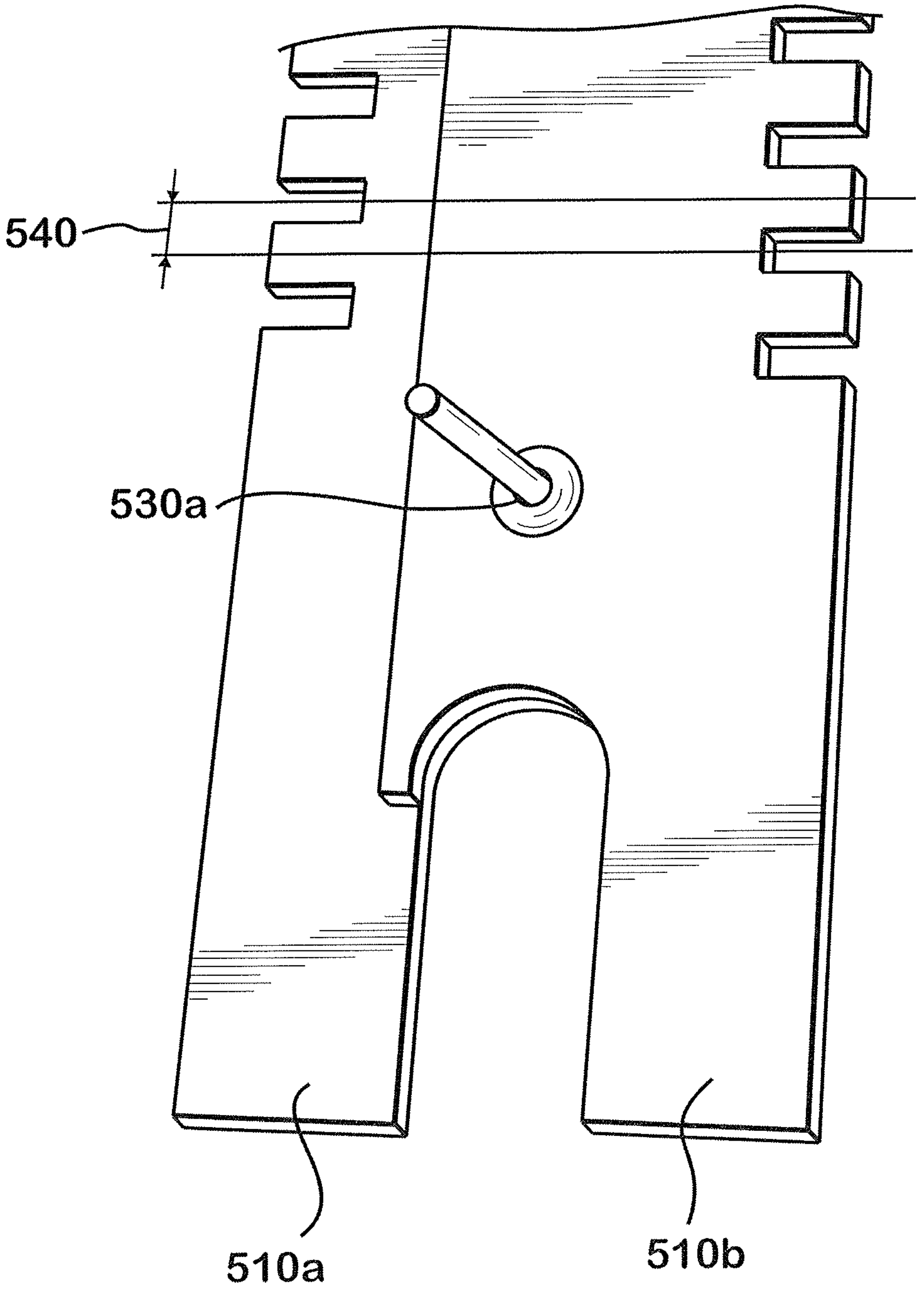

FIG. 9 shows one end (left end) of the structure of FIG. 8, magnified to show greater detail. Insulator pieces 510*a* and 510*b* are made such that when they are aligned and joined together (by rivet 530*a*, for example) the teeth of insulator piece 510*a* and the teeth of insulator piece 510*b* are displaced relative to each other by one-half of the tooth pitch, as shown by the dimension 540. This displacement allows an edge-wound helical resistor element having a pitch equal to the tooth pitch to fit within the teeth of both insulator pieces 510*a* and 510*b*.

To achieve this displacement, two identical insulator pieces may be used, thus simplifying manufacturing. For example, referring back to FIG. 4, two identical pieces as shown in FIG. 4 may be made such that when one of the two pieces is flipped over around a vertical axis and a horizontal axis, and the respective corresponding holes (e.g., 420*a*, 420*b*) are aligned, the two sets of teeth are displaced relative to one another by one-half of the tooth pitch, as shown at 540 in FIG. 9.

Figure 13:
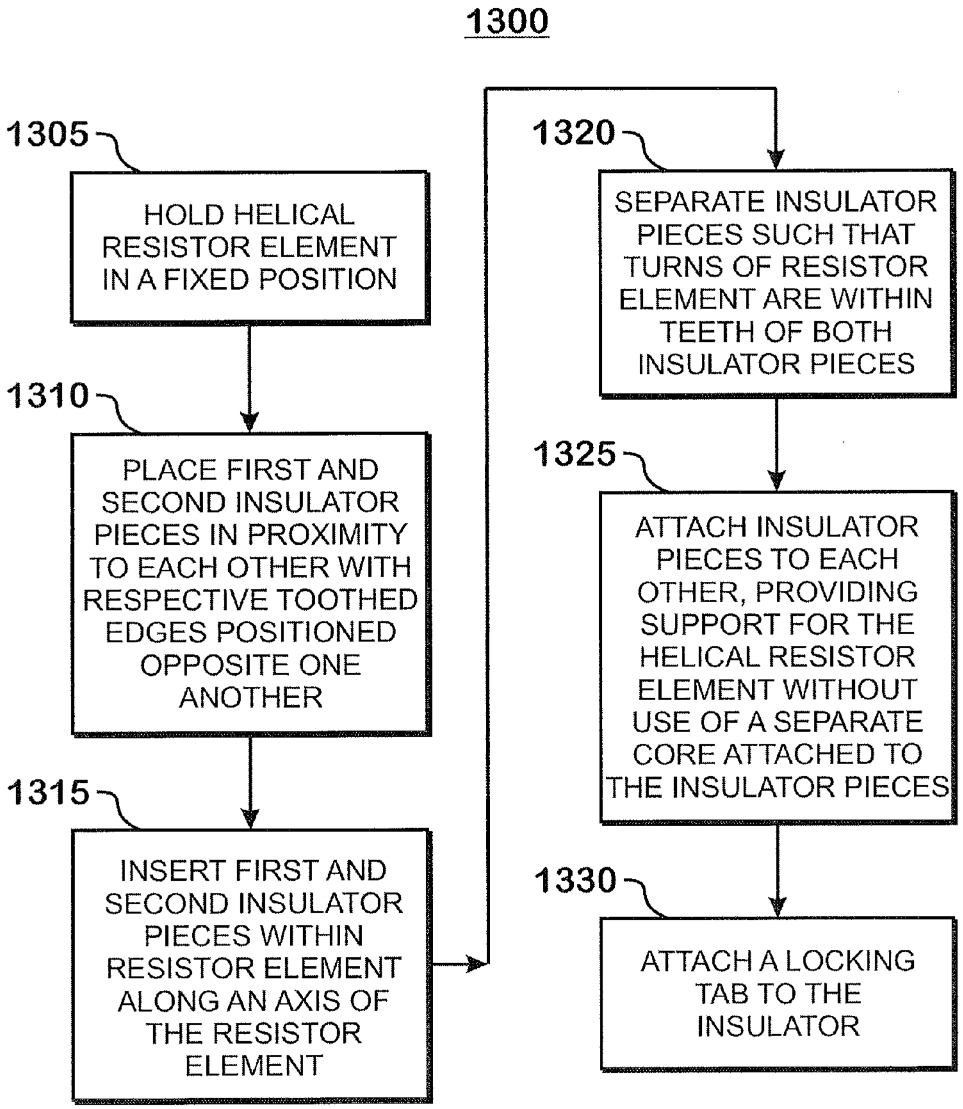
FIG. 13 shows a flow chart of an example method of assembling a resistor.

FIG. 13 summarizes an embodiment of a method 1300 of assembling an edge-wound resistor with a two-piece insulator, such as that shown in FIG. 3, and described hereinbefore. A helical resistor element is held in a fixed position 1305. First and second insulator pieces are placed in proximity to each other with their respective toothed edges positioned opposite one another 1310. The first and second insulator pieces are inserted within the resistor element along an axis of the resistor element 1315. The two insulator pieces are separated such that turns of the helical resistor element are within the teeth of the first and second insulator pieces 1320. The insulator pieces are attached to each other, providing support for the helical resistor element without use of a separate core attached to the insulator pieces 1325. A locking tab may be attached, as described hereinbefore. It should be noted that addition of the locking tab may be optional.

Figure 10:
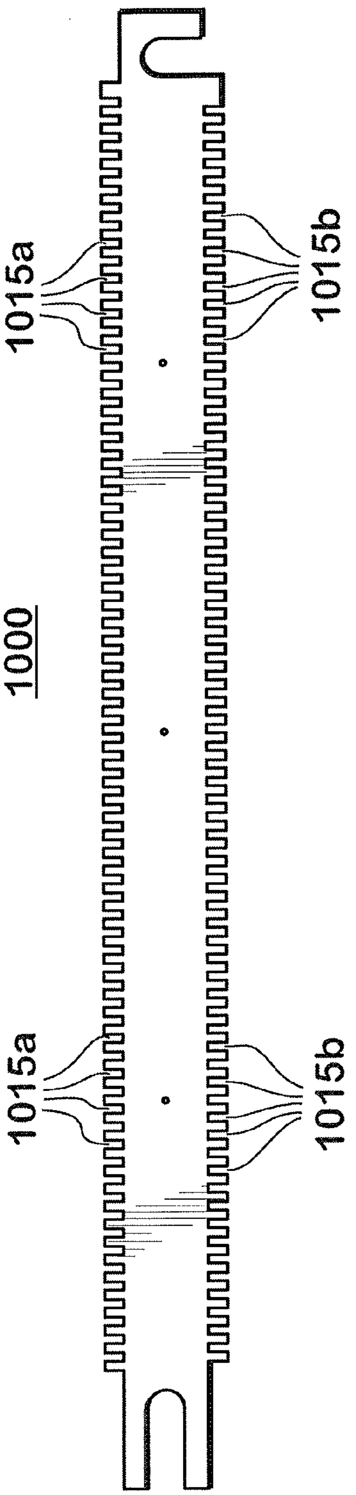
FIGS. 10 and 11 show another example of a method of assembling a resistor.
Figure 11:
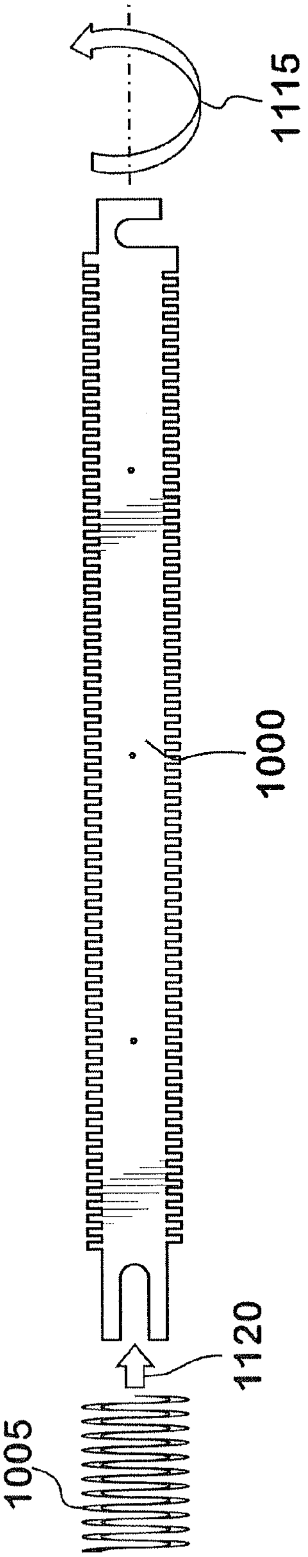
Figure 19:
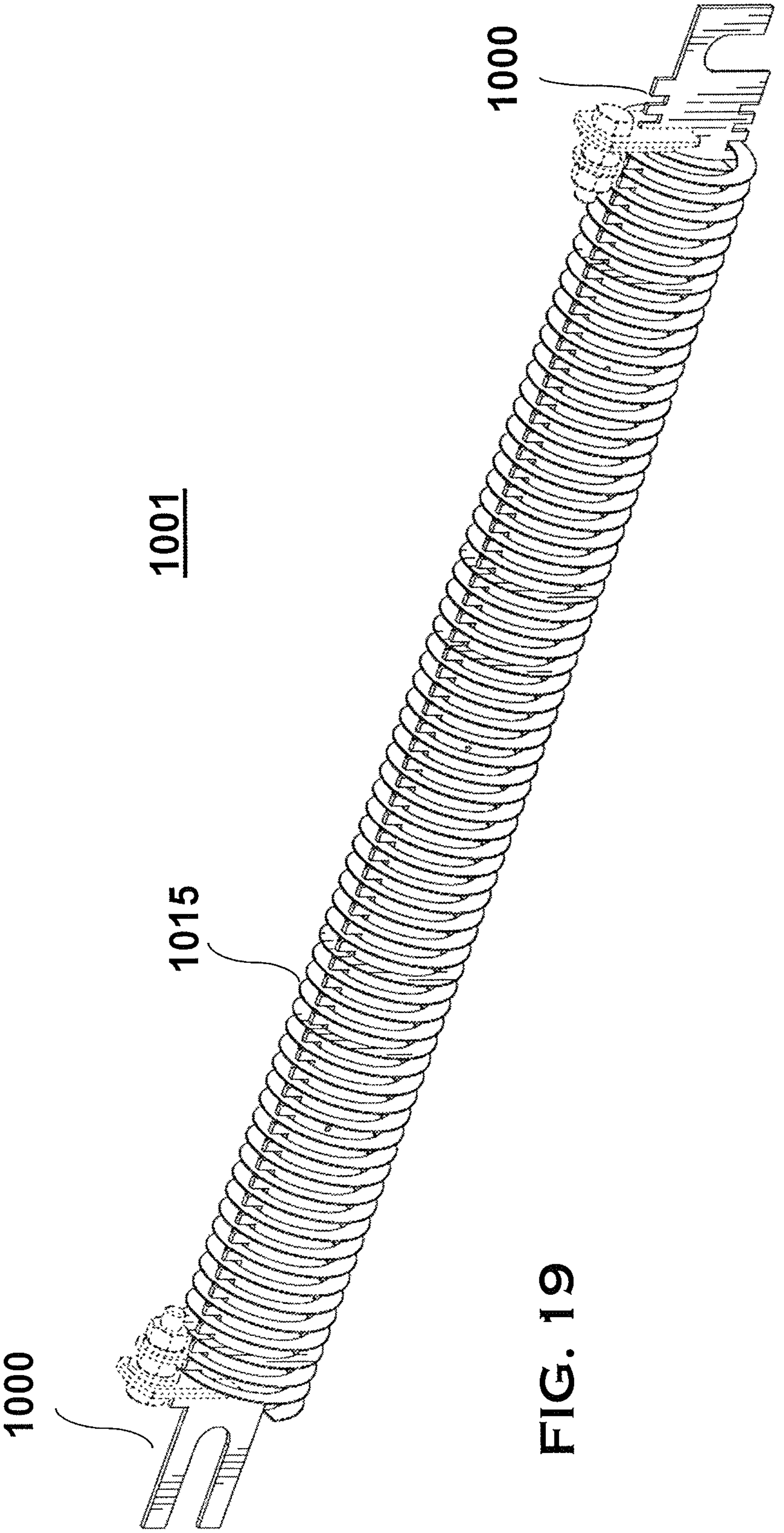
FIG. 19 shows a perspective view of an embodiment of a resistor according to the present invention.

FIGS. 10, 11, and 19 show a second embodiment of a method of assembling an edge-wound resistor, and an illustrative example of an edge-wound resistor 1001 made according to such a method. In this embodiment the insulator is a single insulator piece such as that shown as 1000 in FIG. 10. Single insulator piece 1000 has regularly spaced pluralities of teeth 1015*a* and 1015*b* on each of two opposite sides. Teeth 1015*a* and 1015*b* may both have a pitch equal to the pitch a helical resistor element edge-wound onto insulator piece

1000. Teeth 1015*a* and 1015*b* may be displaced relative to one another by one-half of this pitch, as described hereinbefore.

In this embodiment, a resistor may assembled by winding a helical resistor element edgewise onto the single insulator piece 1000 so that turns of the helical resistor element are within both pluralities of teeth 1015*a* and 1015*b*. FIG. 11 shows how helical resistor element 1005 may be edge-wound onto insulator piece 1000. Insulator piece 1000 may be mounted on a rotating shaft, such as a lathe, and turned about an axis, as indicated by rotation arrow 1115. While insulator piece 1000 is turning, resistor element 1005 is guided onto it, as indicated by arrow 1120. Successive turns of resistor element 1005 are thus guided into the teeth 1015*a* and 1015*b*. In the final structure, insulator piece 1000 provides support for resistor element 1005 without use of a separate core attached to insulator piece 1000, as in existing designs. To complete the process a locking tab (not shown) similar to 325 in FIG. 3 may be attached to prevent movement of resistor element 1005 on insulator piece 1000.

Figure 14:
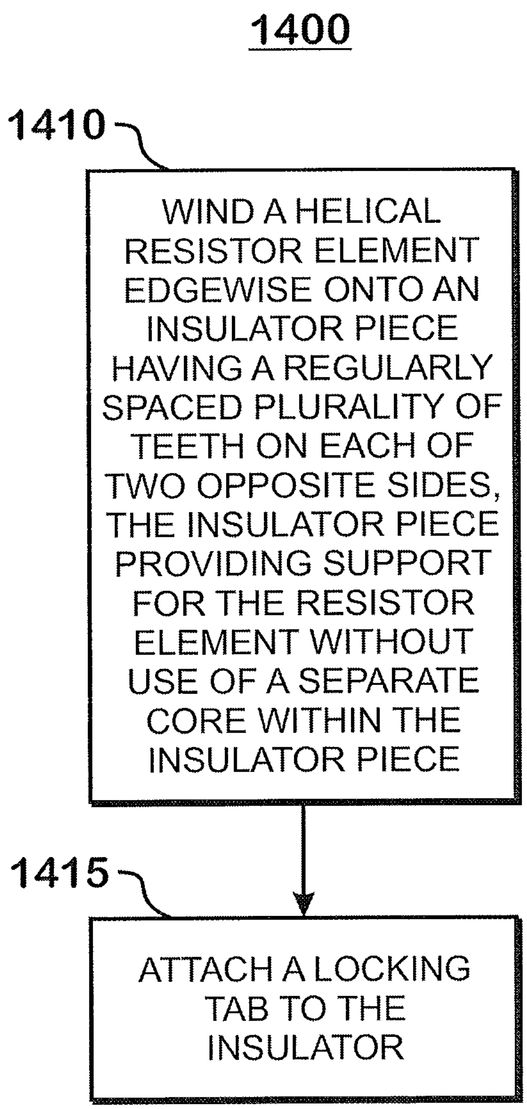
FIG. 14 shows a flow chart of another example method of assembling a resistor.

FIG. 14 summarizes a second embodiment of a method 1400 of assembling an edge-wound resistor with a one-piece insulator, such as that shown in FIGS. 10 and 11, and described hereinbefore. A helical resistor element is wound edgewise onto a single insulator piece 1410. The insulator piece has a regularly spaced plurality of teeth on each of two opposite sides. Turns of the helical resistor element are within teeth on each of two opposite sides of the single insulator piece. The single insulator piece provides support for the helical resistor element without use of a separate core within the single insulator piece 1410. To complete the process, a locking tab may be attached, as described hereinbefore.

Figure 12:
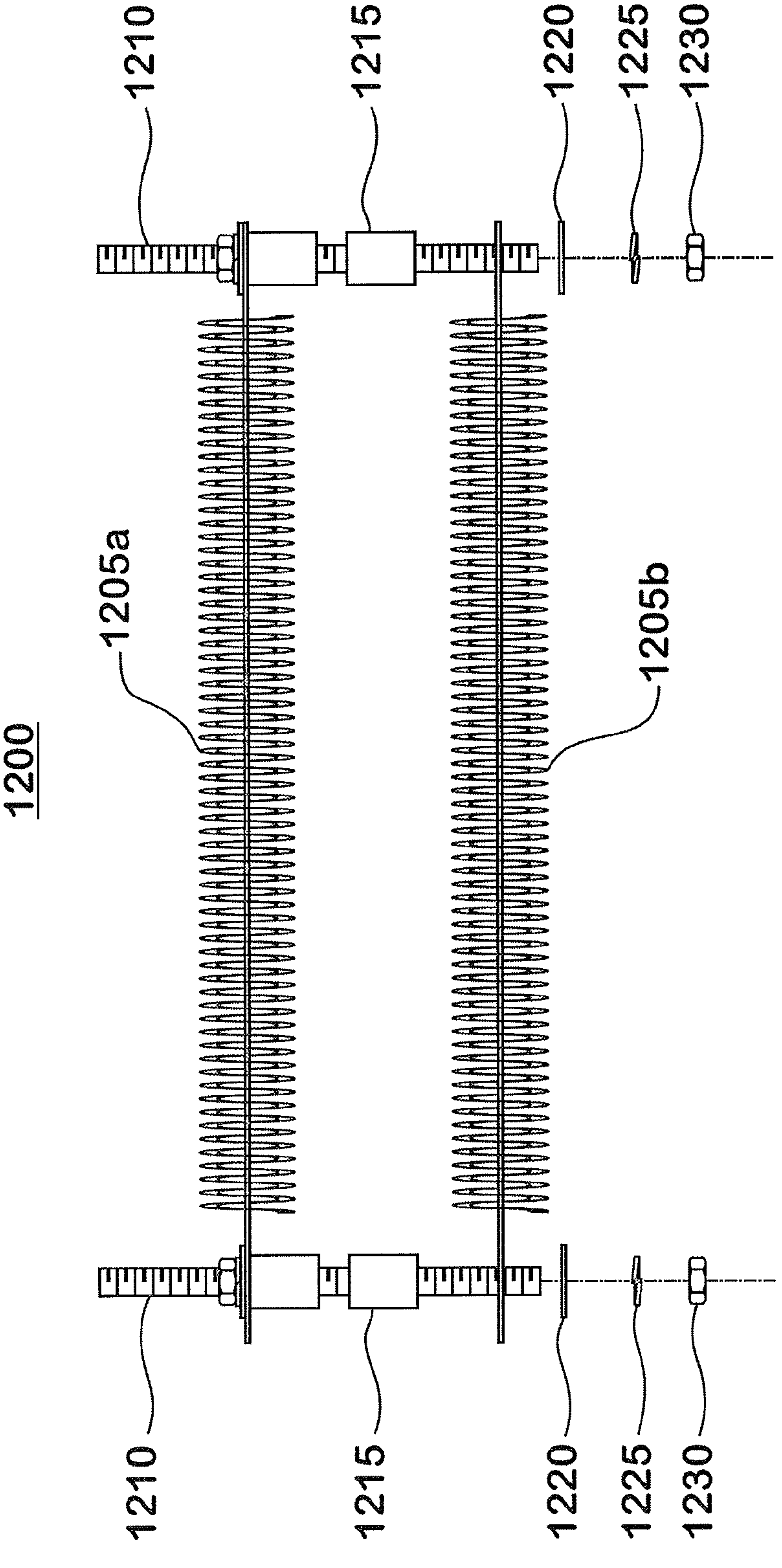
FIG. 12 shows a top exploded view of a resistor assembly.

FIG. 12 is an exploded top view of an example of a resistor assembly 1200 with two edge-wound resistors 1205*a* and 1205*b*. Such assemblies are not limited to two resistors; more than two resistors may be present. Resistors 1205*a* and 1205*b* may both be structured and assembled as described hereinbefore—each one may have a helical resistor element edge-wound on an insulator, the insulator providing support for the helical resistor element without use of a separate core within the insulator. Resistors 1205*a* and 1205*b* are supported by two support rods 1210, one such support rod at each set of corresponding resistor ends. Support rods 1210 may make direct contact with the insulator on which each resistor 1205*a*, 1205*b* is edge-wound, even if support rods 1210 are electrically conducting. There is no need for an additional electrically insulating material between support rods 1210 and the insulators on which the two or more helical resistor elements are edge-wound. This is in contrast to existing designs in which resistor elements are supported by a separate metal core within the insulator and resistors are mounted on a support rod such as 1210 using the ends of metal core. In that case, an additional electrically insulating material must be between the support rods and the metal core to avoid induced current loops in the resistor assembly.

Referring to FIG. 12, neighboring resistors 1205*a* and 1205*b* in the assembly may be separated by spacers 1215, which may be made of any material, conducting or insulating. Resistors 1205*a*, 1205*b* may be held in place by a flat washer 1220, a lock washer 1225, and a nut 1230, although this is not to be considered limiting; many other fastening devices and methods may be used.

The described method embodiments have advantages over existing methods of assembling an edge-wound resistor or resistor assembly. Compared to the described method embodiments, existing methods require additional components and steps, resulting in longer assembly times, additional materials, and higher costs. For example, existing methods may require positioning of leaf springs to hold components in place during assembly, but which still allow movement of those components. As a result, an operator must frequently stop the winding process to readjust component positions. The methods described here eliminate this problem. As pointed out hereinbefore, when two or more described resistors are connected to a conducting support rod to form a resistor assembly such as shown in FIG. 12, there is no need for an additional insulating material between the support rod and the resistors.

Figure 16:
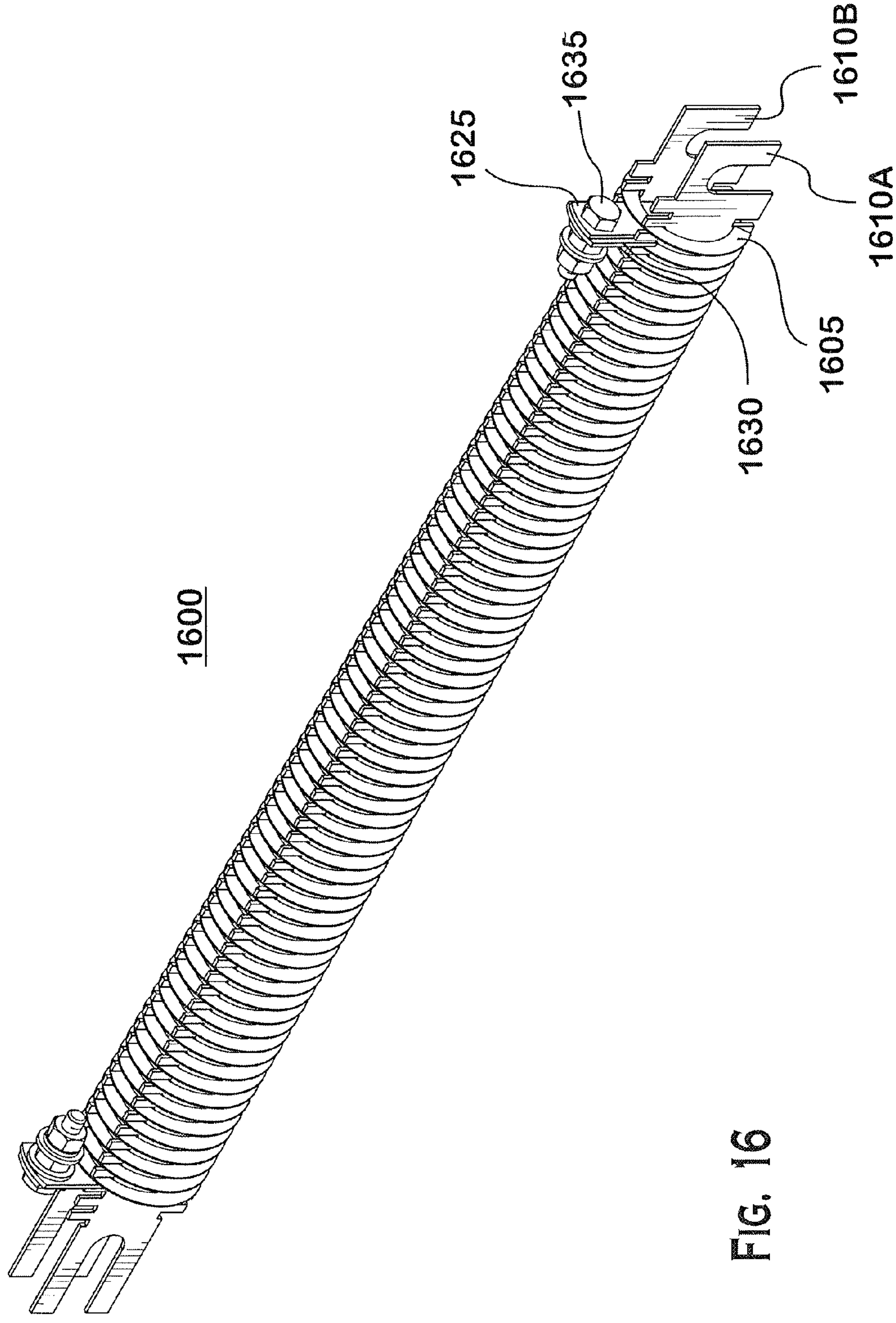
FIG. 16 shows another embodiment of a resistor.
Figure 17:
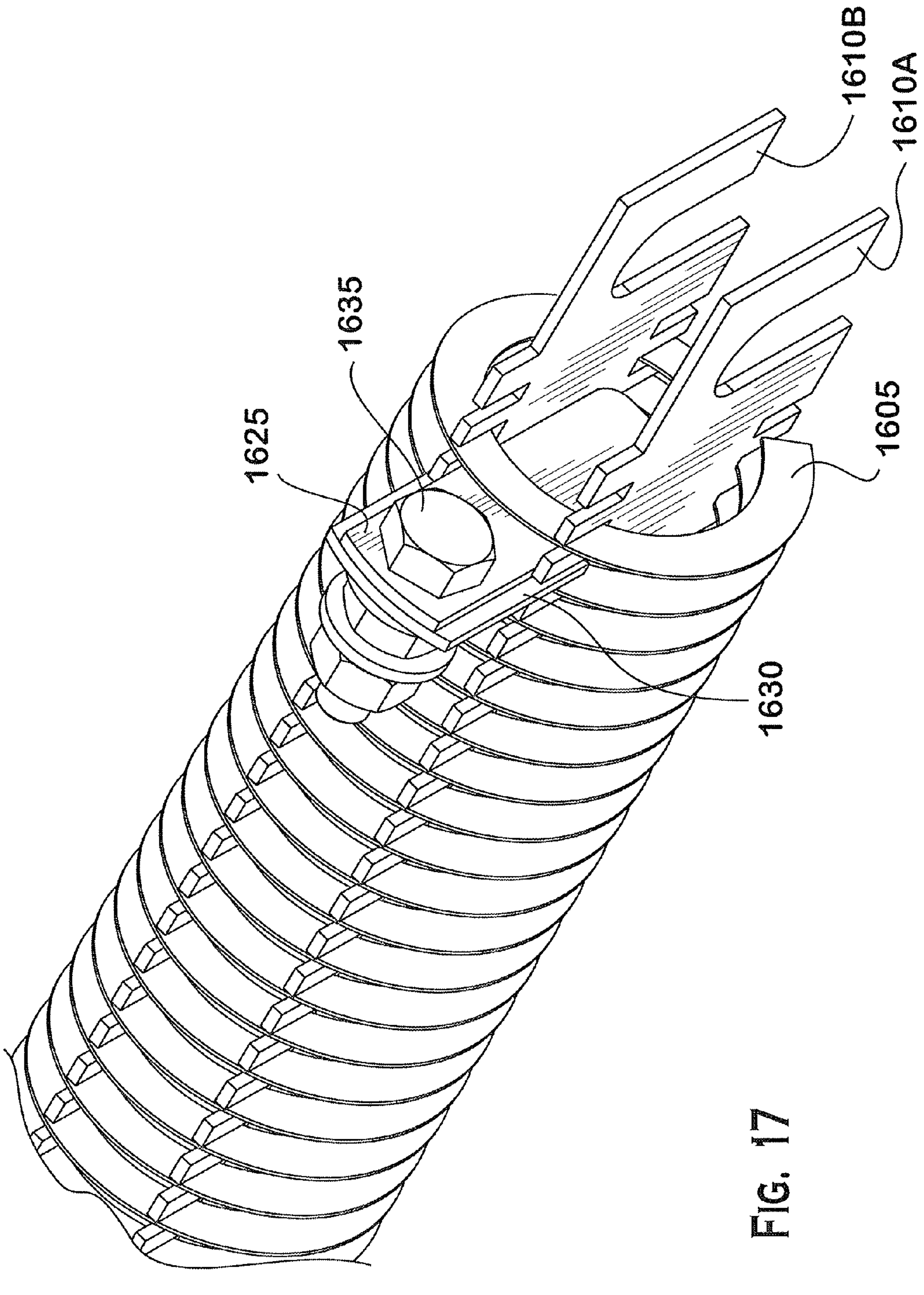
FIG. 17 shows a detail of the resistor embodiment in FIG. 16.

FIGS. 16 and 17 show another embodiment of a resistor 1600. Details of one end of resistor 1600 are shown in FIG. 17 with guide numbers corresponding to those of FIG. 16. In resistor 1600, helical resistor element 1605 is wound within teeth on two insulator pieces 1610A and 1610B. Each insulator piece 1610A and 1610B has a regularly spaced plurality of teeth on each of two opposite sides, and turns of the helical resistor element are within teeth on each of two opposite sides of both insulator pieces 1610A and 1610B.

A locking tab 1625 is configured to prevent movement of resistor element 1605 and also configured to keep insulator pieces 1610A and 1610B at a fixed distance from one another. As shown in FIG. 17, insulator pieces 1610A and 1610B are held separated from one another by the width of locking tab 1625. Locking tab 1625 may be attached to a resistor terminal 1630 that may be welded onto resistor element 1605. This welding may be done before resistor element 1605 is wound onto insulator pieces 1610A and 1610B. Locking tab 1625 may be attached to resistor terminal 1630 with a bolt 1635. Optionally, additional spacers may be inserted between insulator pieces 1610A and 1610B to maintain a fixed distance between them and prevent their motion relative to one another.

At least two resistors 1600 may be combined in a resistor assembly similar to those assemblies described hereinbefore.

Resistor 1600 may be assembled by a method similar, in part, to that shown in FIG. 11. Insulator pieces 1610A and 1610B may be brought into contact with one another, face-to-face, mounted together on a rotating shaft, such as a lathe, and turned about an axis. While insulator pieces 1610A and 1610B are turning, resistor element 1605 may be guided onto both insulator pieces simultaneously. Successive turns of resistor element 1605 are thus guided into the teeth on both sides of both insulator pieces 1610A and 1610B simultaneously. Once resistor element 1605 is fully wound onto both insulator pieces 1610A and 1610B, these two insulator pieces may be separated from one another to achieve the structure shown on FIGS. 16 and 17. Locking tab 1625 may then be attached to prevent motion of resistor element 1605 and insulator pieces 1610A and 1610B and to maintain a constant distance between insulator pieces 1610A and 1610B.

Thus, an edge-wound resistor and a method for making it have been described. The examples presented are not to be construed as limiting. In particular, the method embodiments described herein may be applicable to other resistor types, such as wire-wound resistors, without departing from the spirit or scope of the following claims.

Although the features and elements of the present invention are described in the example embodiments in particular combinations, each feature may be used alone without the other features and elements of the example embodiments or in various combinations with or without other features and elements of the present invention. Changes in the form and the proportion of parts as well as in the substitution of equivalents are contemplated as circumstances may suggest or render expedient without departing from the spirit or scope of the following claims.

What is claimed is:

1. A resistor comprising:

a first insulator, the first insulator having a regularly spaced plurality of teeth on each of two opposite sides;

a second insulator, the second insulator having a regularly spaced plurality of teeth on each of two opposite sides;

a helical resistor element edge-wound on the first and second insulators and situated within teeth of the first and second insulators;

wherein the first and second insulators provide support for the helical resistor element without use of separate cores within the insulators.

2. The resistor of claim 1, wherein the helical resistor element is a conductor having an essentially rectangular cross-section, the conductor configured as a single helix.

3. The resistor of claim 1, wherein the first insulator is a single piece of electrically insulating material, and the second insulator is a single piece of electrically insulating material.

4. The resistor of claim 1, wherein each insulator is planar.

5. A resistor comprising:

a helical resistor element edge-wound on an insulator, the insulator comprising two attached pieces of electrically insulating material, the insulator having a regularly spaced plurality of teeth on each of two opposite sides, the helical resistor element situated within the teeth;

wherein the insulator provides support for the helical resistor element without use of a separate core within the insulator.

6. The resistor of claim 5, wherein each of the attached pieces is planar.

7. The resistor of claim 6, wherein the attached planar pieces are parallel.

8. The resistor of claim 5, wherein each of the attached pieces comprises an untoothed edge and an opposite toothed edge.

9. The resistor of claim 5, wherein the two pieces overlap and are attached to each other with rivets.

10. A resistor comprising:

a helical resistor element edge-wound on an insulator, the insulator having a regularly spaced plurality of teeth on each of two opposite sides, the helical resistor element situated within the teeth;

wherein the insulator provides support for the helical resistor element without use of a separate core within the insulator, and wherein the insulator comprises at least one of: a glass, fiberglass, ceramic, mica board, silicon bonded mica laminate, steatite, cordierite, alumina, or pressed magnesium oxide.

11. A resistor assembly comprising two or more resistors , the two or more resistors comprising:

a helical resistor element edge-wound on an insulator, the insulator having a regularly spaced plurality of teeth on each of two opposite sides, the helical resistor element situated within the teeth;

wherein the insulator provides support for the helical resistor element without use of a separate core within the insulator;

wherein the two or more resistors are supported by a support rod at each set of corresponding resistor ends, without an insulating material between the support rods and the insulators on which helical resistor elements of the two or more resistors are edge-wound.

12. The resistor of claim 1, further comprising a locking tab configured to maintain a constant distance between the insulators.

* * * * *